United States Patent
Ashjaee et al.

(10) Patent No.: US 6,852,208 B2
(45) Date of Patent: *Feb. 8, 2005

(54) METHOD AND APPARATUS FOR FULL SURFACE ELECTROTREATING OF A WAFER

(75) Inventors: Jalal Ashjaee, Cupertino, CA (US); Boguslaw Nagorski, San Jose, CA (US); Bulent M. Basol, Manhattan Beach, CA (US); Homayoun Talieh, San Jose, CA (US); Cyprian Uzoh, San Jose, CA (US)

(73) Assignee: NuTool, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/265,460

(22) Filed: Oct. 3, 2002

(65) Prior Publication Data

US 2003/0029731 A1 Feb. 13, 2003

Related U.S. Application Data

(63) Continuation-in-part of application No. 09/735,546, filed on Dec. 14, 2000, now Pat. No. 6,482,307, which is a continuation-in-part of application No. 09/685,934, filed on Oct. 11, 2000, now Pat. No. 6,497,800, said application No. 10/265,460.

(60) Provisional application No. 60/203,944, filed on May 12, 2000, and provisional application No. 60/190,023, filed on Mar. 17, 2000.

(51) Int. Cl.[7] .................................................. C25D 5/00
(52) U.S. Cl. ..................... 205/137; 205/149; 205/157; 205/103; 205/652; 205/654; 205/662; 205/663; 205/686; 204/224 R; 204/224 M; 204/279; 204/228.3
(58) Field of Search ....................... 204/224 R, 224 M, 204/279, 228.3; 205/137, 149, 157, 103, 652, 654, 662, 663, 686

(56) References Cited

U.S. PATENT DOCUMENTS

| | | | |
|---|---|---|---|
| 6,482,307 B2 * | 11/2002 | Ashjaee et al. | 205/103 |
| 6,497,800 B1 * | 12/2002 | Talieh et al. | 204/224 R |
| 6,527,925 B1 * | 3/2003 | Batz et al. | 204/297.01 |

* cited by examiner

*Primary Examiner*—Wesley A. Nicolas
(74) *Attorney, Agent, or Firm*—NuTool Legal Department (57) ABSTRACT

Deposition of conductive material on or removal of conductive material from a workpiece frontal side of a semiconductor workpiece is performed by providing an anode having an anode area which is to face the workpiece frontal side, and electrically connecting the workpiece frontal side with at least one electrical contact, outside of the anode area, by pushing the electrical contact and the workpiece frontal side into proximity with each other. A potential is applied between the anode and the electrical contact, and the workpiece is moved with respect to the anode and the electrical contact. Full-face electroplating or electropolishing over the workpiece frontal side surface, in its entirety, is thus permitted.

16 Claims, 8 Drawing Sheets

METHOD AND APPARATUS FOR FULL SURFACE ELECTROTREATING OF A WAFER

RELATED APPLICATIONS

This application is a continuation in part of U.S. Ser. No. 09/735,546 filed Dec. 14, 2000 (NT-109), and now U.S. Pat. No. 6,482,307, claiming priority to Prov. No. 60/203,944 filed May 12, 2000, and U.S. Ser. No. 09/685,934 filed Oct. 11, 2000 (NT-105), and now U.S. Pat. No. 6,497,800, claiming priority to Prov. No. 60/190,023 filed Mar. 17, 2000, all incorporated herein by reference.

FIELD

The present invention is related to a method and apparatus for full surface electrotreating of a wafer, where electrotreating includes electroplating or electropolishing.

BACKGROUND

Multi-level integrated circuit (IC) manufacturing requires many steps of metal and insulator film depositions followed by photoresist patterning and etching or other means of material removal. After photolithography and etching, the resulting wafer or substrate surface is non-planar and contains many features such as vias, lines or channels. Often, these features need to be filled with a specific material such as a metal or other conductor. Once filled with a conductor, the features provide the means to electrically interconnect various parts of the IC.

Figure 1:
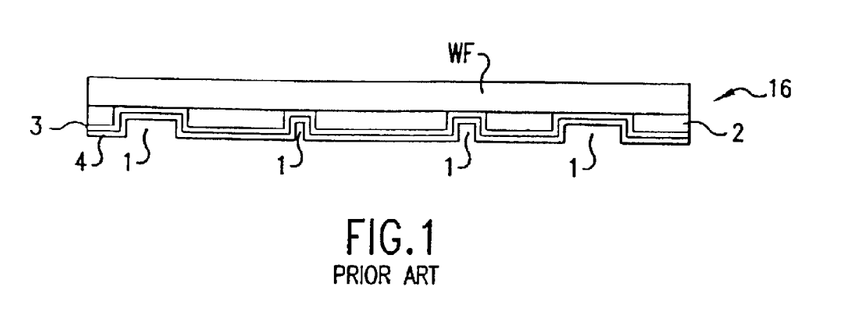
FIG. 1 is an illustration of the known structure of a wafer or substrate to be coated with Cu.

Electrodeposition is a technique used in IC manufacturing for the deposition of a highly conductive material, such as copper (Cu), into the features on the semiconductor wafer surface. FIG. 1 is a schematic illustration of a wafer or substrate 16 to be coated with Cu. Features 1 may be vias, trenches, bond pads, etc., and are opened in the dielectric or insulator layer 2. To achieve Cu deposition, a barrier layer 3 is first deposited over the whole wafer surface. Then, a conductive Cu seed layer 4 is deposited over the barrier layer 3. An electrical contact is made to the barrier layer 3 and/or the seed layer 4, the wafer surface is exposed to a Cu plating electrolyte, and a cathodic voltage is applied to the wafer surface with respect to an anode which also makes physical contact with the electrolyte. In this way, Cu is plated out of the electrolyte, onto the wafer surface, and into the features 1.

The terms "wafer" and "substrate" are used interchangeably above and throughout the remaining description. Referring to the example shown in FIG. 1, it is to be understood that the "wafer" or "substrate" referred to includes the wafer WF per se, the dielectric or insulator layer 2, and the barrier layer 3, with or without the seed layer 4. These terms, of course, may also refer to a wafer WF per se, including one or more previously processed layers, a further dielectric or insulator layer, and a further barrier layer, with or without a further seed layer.

The electrical contact to the seed layer and/or the barrier layer is typically made along the periphery of the wafer, which is usually round. This approach works well for thick and highly conductive seed layers and small wafer diameters (e.g. 200 mm). However, the trend in the semiconductor industry is to go to larger wafers (e.g. 300 mm) and smaller feature sizes (smaller than 0.18 microns). Smaller feature sizes, as well as cost considerations, require the use of the thinnest possible seed layers. As the wafer size increases, the plating current value also increases. As the seed layer thickness decreases, the sheet resistance increases, and the voltage drop between the middle and the edge of a large wafer also increases. Therefore, voltage drop becomes a major problem, especially for large wafers with thin seed layers. This voltage drop results in non-uniform Cu deposition on the wafer surface, the regions near the contacts being typically thicker than other regions.

One other consideration in Cu plating is the "edge exclusion". Conventional Cu plating heads typically use contacts around peripheries of the wafers. Consequently, making electrical contact and, at the same time, providing a seal against possible electrolyte leakage is difficult.

Figure 2:
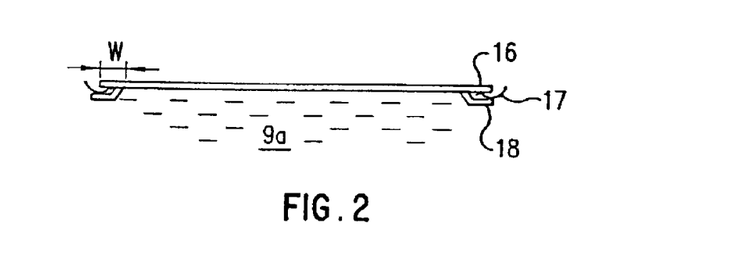
FIG. 2 is a cross sectional side view of one type of a wafer or substrate contacting scheme.

FIG. 2 shows a cross sectional view of a contacting scheme in which the wafer or substrate 16 is contacted by a ring-shaped contact 17 which is sealed by a ring seal 18 against exposure to the electrolyte 9a. The seal 18 also prevents the electrolyte 9a from reaching the back surface of the wafer or substrate 16. Such a contacting scheme extends a distance "W" from the edge of the wafer. The distance "W" is referred to as "edge exclusion" and may typically be 3–7 mm. Minimizing "W" would allow better utilization of the wafer surface for IC fabrication. There is, therefore, a need to develop new and novel approaches to provide electrical contacts to the surface of semiconductor wafers during electrodeposition of conductors.

SUMMARY

It is a primary object of this invention to provide alternative methods of, and alternative apparatuses for, making electrical contact to a wafer frontal side surface which permits complete or full-face electroplating or electropolishing over the entire wafer frontal side surface. According to one method, an anode having an anode area is provided, and electrical contact to the wafer frontal side, using electrical contacts outside the anode area, is made by pushing the electrical contacts against the wafer. The wafer is moved with respect to the anode and the electrical contacts. Polarities of the anode and the electrical contacts can be reversed to alternatively permit deposition of conductive material on the wafer frontal side and removal of conductive material from the wafer frontal side. At least some of the electrical contacts can slide laterally off of the wafer frontal side while the wafer is moved with respect to the anode and the electrical contacts.

Movement of the wafer with respect to the anode and the electrical contacts can be performed by displacing a carrier head which holds the wafer, by displacing the anode and the electrical contacts, or by both displacing the carrier head which holds the wafer and displacing the anode and the electrical contacts. The electrical contacts can be pushed against and touch the frontal side of the wafer in order to make the electrical contact, or can make electrical contact, without touching the wafer frontal side, by way of a "field effect". The electrical contacts may include any of pins, rollers, wires, and brushes. Pushing the electrical contacts against the wafer can be performed by either moving the wafer toward the contacts or by moving the contacts toward the wafer.

According to another, similar method, conductive material is deposited on or removed from a wafer frontal side of a semiconductor wafer by providing an anode having an anode area which is to face the wafer frontal side, and electrically connecting the wafer frontal side with at least one electrical contact outside of the anode area by pushing the electrical contact and the wafer frontal side into proximity with each other. A potential is applied between the anode and the electrical contact, and the wafer is moved with respect to the anode and the electrical contact. The potential can have a first polarity which produces deposition of the conductive material on the wafer frontal side, and a second potential, having a reversed polarity, can be subsequently applied to remove conductive material. Conversely, the first polarity can be one which produces removal of conductive material from the wafer frontal side, and the second potential can be one which is used to deposit conductive material. Polishing of the conductive material can be performed while applying the potential and moving the wafer with respect to the anode and the electrical contact. The apparatus for depositing conductive material on or removing conductive material from the wafer frontal side of the semiconductor wafer includes, among other elements, an anode having an anode area which is to face the wafer frontal side. Electrical contacts are located outside of the anode area, and can be electrically connected with the wafer frontal side by pushing the electrical contacts and the wafer frontal side into proximity. As noted above, the wafer can be moved with respect to the anode and the electrical contacts during application of a potential between the anode and the electrical contacts to permit deposition or removal of the conductive material. A contact ring, by which the electrical contacts are supported so as to surround the anode, can be provided, and a porous pad can overlie the anode to permit polishing of the conductive material. The anode area can be either circular or non-circular.

DRAWINGS

The foregoing and other features, aspects, and advantages will become more apparent from the following detailed description when read in conjunction with the following drawings.

DETAILED DESCRIPTION

The detailed description provides a number of embodiments and methods for performing the invention. Several examples are given that are intended to set forth the best mode of practicing the invention while not limiting the scope of the invention. For example, references may be made to anode and cathode, while in other cases the more general term electrode may be used. It is anticipated that elements of the invention and terms used herein may be interchangeable with one another and can be modified within the spirit of the invention set forth herein.

A number of approaches to providing improved electrical contacts to the surfaces of semiconductor wafers during electrodeposition of conductors or during electro-etching or electropolishing are described in U.S. Ser. No. 09/685,934 entitled Device Providing Electrical Contact To The Surface Of A Semiconductor Workpiece During Metal Plating And Method Of Providing Such Contact, incorporated herein by reference. This apparatus described herein can also be used for plating and polishing as disclosed in U.S. Pat. No. 6,402,925 entitled Method And Apparatus For Electrochemical Mechanical Deposition, incorporated herein by reference.

Figure 3:
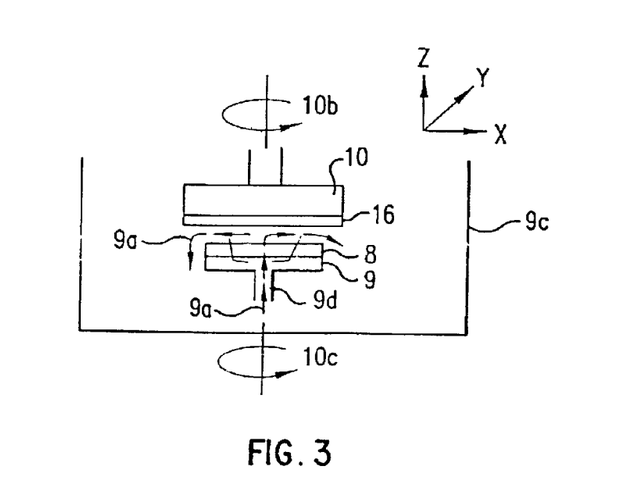
FIG. 3 is a schematic illustration of an overall apparatus in which the present invention may be utilized.

A general depiction of one version of a plating apparatus is shown in FIG. 3. The carrier head 10 holds the wafer 16. The wafer has the barrier layer and the seed layer (not shown in FIG. 3) deposited on its surface, and therefore its surface is conductive. The head can be rotated around a first axis 10b. It can also be moved in the x, y, and z directions. A pad 8 is placed on an anode plate 9 across from the wafer surface. The pad surface may itself be abrasive, or the pad may contain an abrasive material. Pad designs and structures form the subject matter of U.S. Ser. No. 09/511,278, filed Feb. 23, 2000, entitled Pad Designs And Structures For A Versatile Materials Processing Apparatus, and U.S. Ser. No. 09/621,969, filed Jul. 21, 2000, entitled Pad Designs And Structures With Improved Fluid Distribution. The disclosure of each of these applications is incorporated herein by reference.

Electrolyte 9a is supplied to the wafer surface through openings in the anode plate and the pad as shown by the arrows in FIG. 3. U.S. Ser. No. 09/568,584, filed May 11, 2000, entitled Anode Assembly For Plating And Planarizing A Conductive Layer, discloses an anode plate, while U.S. Ser. No. 09/544,558, filed Apr. 6, 2000, entitled Modified Plating Solution For Plating And Planarization, discloses an electrolyte, both incorporated herein by reference. The electrolyte then flows over the edges of the pad into the chamber 9c to be re-circulated after cleaning/filtering/refurbishing. An electrical contact 9d is provided to the anode plate. The anode plate turns around the axis 10c. In some applications, the plate may also be translated in the x, y, and/or z directions. Axes 10b and 10c are substantially parallel to each other. The diameter of the pad 8 is typically smaller than the diameter of the wafer surface exposed to the pad surface, although it may also be larger. The gap between the wafer surface and the pad is adjustable by moving the carrier head and/or the anode plate in the z direction. In one mode of operation, the workpiece (i.e., the wafer or substrate) may be brought close to the pad, without touching the pad. In this mode, during material deposition, the workpiece hydroplanes or floats over the pad or anode. In another mode of operation, the wafer surface and the pad may be in contact. When the wafer surface and the pad are touching, the pressure that is exerted on the wafer and pad surfaces can also be adjusted.

Figure 4:
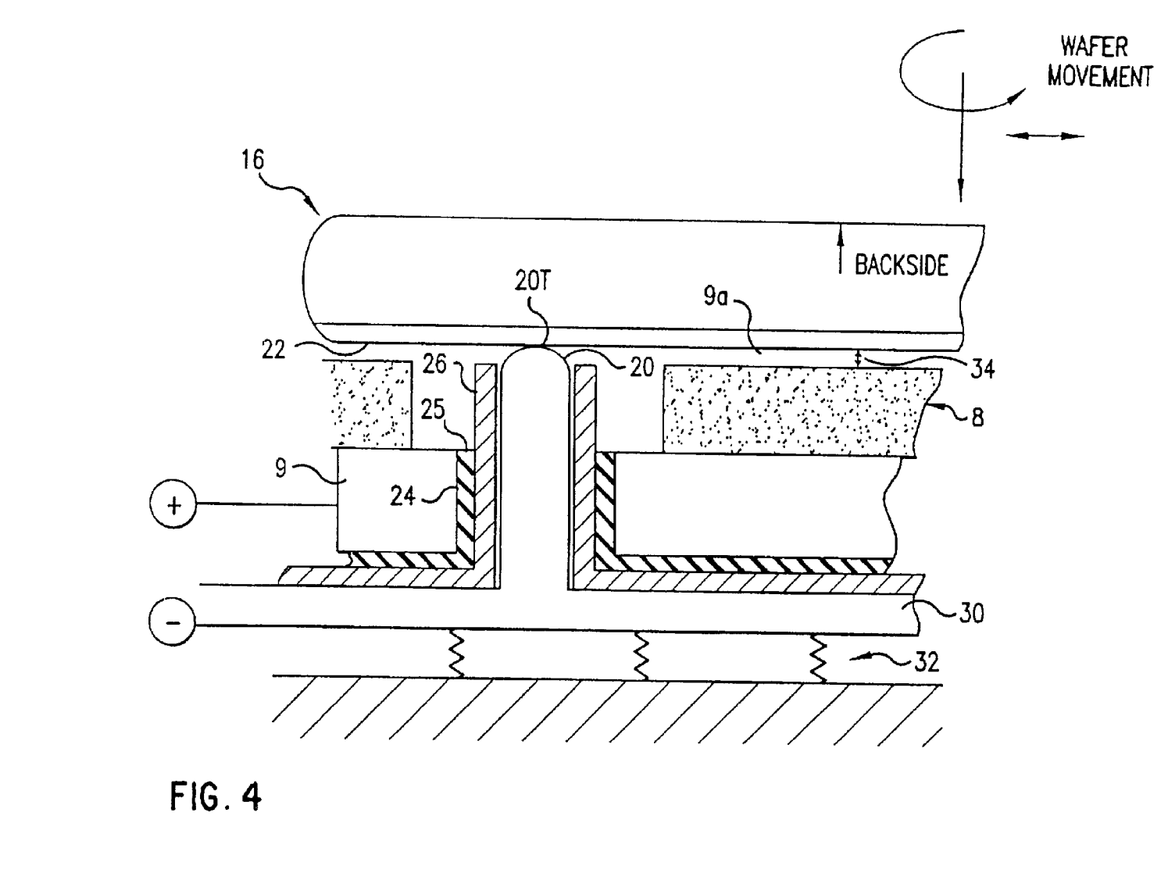
FIG. 4 shows an electrical contact embodiment used in one type of device providing electrical contact to a wafer surface.

Electrical connection to the wafer surface can be made by way of multiple electrical contacts formed by pins that come up through the pad 8 and touch the wafer surface. Assuming by way of example that it is the structure shown in FIG. 1 that is to be plated, and referring now to FIG. 4, it will be understood that the wafer surface 22 is formed by the exposed surface of the seed layer 4. A magnified view of one of the multiple electrical contacts which can be used is shown in FIG. 4. Holes 24 have been provided in the anode plate 9 to accommodate the pins 20. These pins 20 are electrically isolated from the anode plate 9 by an insulator 26. The insulator may be a ceramic or other appropriate dielectric material. A seal 25 is interposed between the anode plate 9 and the insulator 26. The pins 20 forming the electrical contacts are an integral part of a cathode plate 30, which is also electrically isolated from the anode plate 9 by the insulator 26. The cathode plate 30 is spring loaded by suitable springs 32 which bias or push the rounded tips 20T of the pins 20 towards the wafer surface 22 during the plating operation. Thus, the electrical contacts can slide up under the spring bias and down against the spring bias to adjust dynamically to the carrier head or workpiece location relative to the anode plate.

A roller ball, similar to that which could be used in a ball-point pen, can be incorporated at the tips 20T to prevent scratching the wafer surface. Various additional or alternative electrical contact configurations will be described in connection with FIGS. 10–15. Soft conductive brushes could also be used to make contact to the wafer surface. It is important that the selected contacts do not scratch the wafer surface excessively.

For plating, the electrolyte 9a is supplied to the gap 34 between the pad 8 and the wafer surface 22 and thus is brought into physical contact with the wafer surface and the anode plate. In one mode of operation, the wafer 16 is brought down until its surface 22 makes physical contact to the tips 20T of the pins 20. A potential is applied between the cathode plate 30 and the anode plate 9, making the cathode plate 30 more negative than the anode plate 9. Therefore, the wafer surface is also rendered cathodic through the pins 20. Under applied potential, copper plates out of the electrolyte 9a onto the wafer surface 22. By adjusting the gap 34 between the pad 8 and the wafer surface 22 and/or by adjusting the pressure with which the pad 8 and the wafer surface 22 touch each other, one can achieve just plating, or plating and polishing. For effective polishing it is preferred that the pad 8 have an abrasive surface or that the whole pad 8 is abrasive.

During plating, the wafer or substrate 16 and the anode plate/pad assembly 8, 9 should rotate with respect to one another so that plating takes place uniformly. They may also translate in one or two directions. The electrolyte 9a typically fills any gap 34 between the pad 8 and the wafer surface 22. The electrolyte can be either applied through channels in the anode plate 9 and the pad 8 (not shown in FIG. 4) or, if the gap 34 is large (e.g. 2 mm or larger), provided into the gap 34 from the edges of the wafer.

The pin tips 20T, or the tips of other types of electrical contacts which will be described, may be disposed in close proximity to the wafer surface 22 without touching this surface for other applications. Moreover, under a potential applied between the wafer and the anode plate, copper may be either plated onto or removed from the wafer, depending on the polarity of the wafer. Circuitry used for application and adjustment of the applied potential, and for inverting the polarity of the potential, is well known and commonly used.

Figure 5:
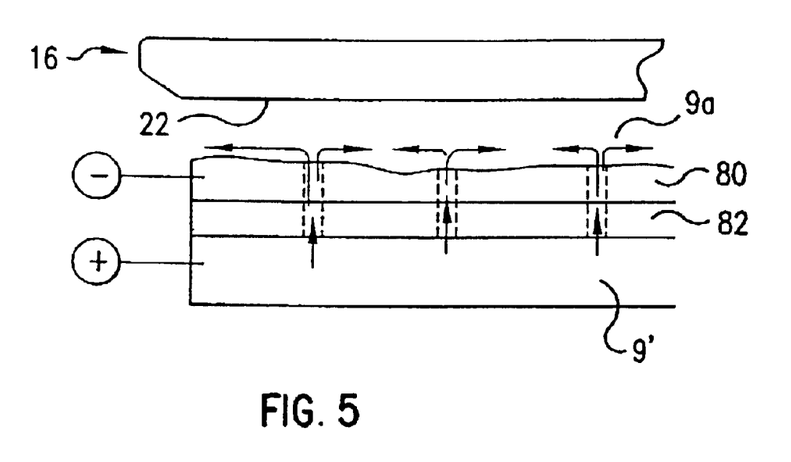
FIG. 5 shows another electrical contact.

In the construction shown in FIG. 5, electrical contact to the wafer surface is made by way of a potential conductive pad 80. This pad 80 is used in place of the multiple pins 20. In this case, an insulating spacer 82 of ceramic or other dielectric material is placed directly over the anode plate 9' between the anode plate 9' and the conductive pad 80. Electrical supply contacts are made to the conductive pad 80 and the anode plate 9', and a cathodic potential is applied to the pad 80, with electrolyte 9a making physical contact to the anode plate 9', the pad 80 and the wafer surface 22. When the substrate or wafer 16 is brought down and engages the pad, it gets energized and Cu plating on the wafer surface 22 commences. The construction shown in FIG. 5 is similar to certain pad designs and structures forming the subject matter of application Ser. No. 09/511,278, filed Feb. 23, 2000, mentioned previously. Additionally, U.S. Ser. No. 09/483,095, filed Jan. 14, 2000, entitled Semiconductor Workpiece Proximity Plating Methods And Apparatus, discloses conductive pad strips used on cylindrical anodes. In other applications, the potential conductive pad 80 may be allowed to float with respect to the wafer surface 22 during material deposition or removal. The potential, moreover, may be pulsed to produce impulse plating. Again, the circuitry used for pulsing the potential is well known and commonly used.

In both approaches described above and in others which will be described, some Cu plating may take place on the exposed cathodic surfaces besides the wafer surface. In the case of pins, for example, exposed regions of the pins may get coated. In case of a conductive pad, the whole pad may get coated. Therefore, it is of utmost importance to select the right conductive materials to be used for the construction of the electrical contacts and the pads. The materials should be such that plating on the Cu coated wafer surface (i.e. the seed layer 4 of FIG. 1) should be preferable or more efficient than plating on the pad or contact surface. Examples of proper materials for the pads may be various conductive polymers or polymeric materials that are coated with refractory metals such as Ta, alpha Ta, W, Mo or their nitrides. The pins or other electrical contacts can be made of conductive polymers or refractory metals such as Mo, Ta and W; alternatively, the pins or other cathode contacts can be made of any conductive metal such as Cu or Ni, or of a conductive alloy such as Cu—Be, Cu—Ag, Ag—Pt, etc., but these metals or alloys may be coated by a refractory metal or compound and/or a nitride of a refractory metal, such as TaN or TiN, or of a refractory compound. These are just some examples. There are many more materials on which Cu does not deposit efficiently.

Figure 6:
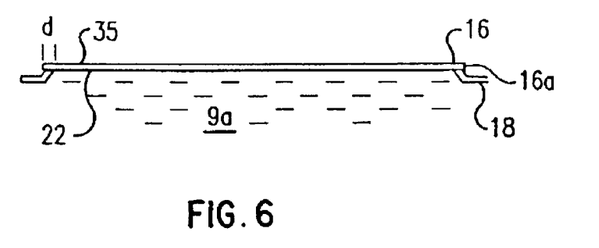
FIG. 6 is a cross sectional side view similar to FIG. 2 but showing a reduction in wafer edge exclusion.

By employing an electrical contact or connection to a wafer surface which is distributed all over the surface rather than just at the periphery, the "edge exclusion" discussed earlier in connection with FIG. 2 can be reduced on the wafer. As shown in FIG. 6, eliminating the need for a contact ring to contact the periphery of the wafer permits a reduction of the edge exclusion "d". The seal 18 can be either on the surface 22 of the wafer 16 facing the electrolyte 9a or right at the edge 16a of the wafer. The seal 18 may even be disposed on the surface 35 of the wafer 16 facing away from the electrolyte 9a.

Figure 7:
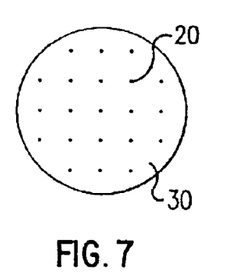
FIGS. 7, 8 and 9 show various individual electrical contact distributions.
Figure 8:
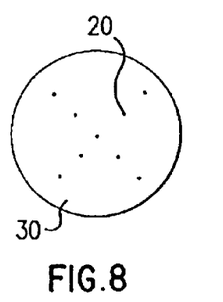
Figure 9:
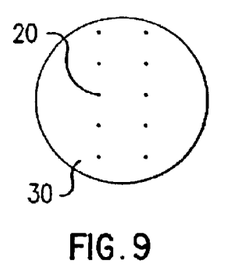

Various electrical contact distributions may be used. FIGS. 7–9 schematically show three possible types of distribution of pins 20 over a cathode plate 30. As a rule, as the number of electrical contacts increases, the voltage drop from the center to the edge of the wafer will become smaller, and the thickness of the plated metal becomes more uniform.

Although Cu has been mentioned as the plated metal, practically any metal or conductive alloy can be plated on a wafer/substrate surface. Also, although an electroplating technique and an electroplating apparatus have been described, the same apparatus can be utilized for electroetching and/or electro-polishing. In these cases, the polarity of the voltage applied between the anode and cathode plates is reversed, making the substrate surface more positive. An electroetching electrolyte may be used. Again, the circuitry used for application and adjustment of the voltage, and for inversion of the voltage polarity, is well known and commonly used.

Figure 10:
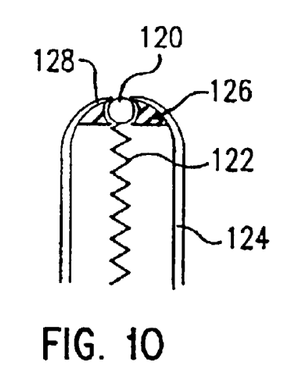
FIG. 10 shows another electrical contact.

FIG. 10 shows one of a plurality of electrical contacts which may be used as alternatives to, or together with, pins such as the pins 20, or together with other electrical contact configurations, to provide electrical connection to a wafer surface. FIGS. 11–13 and 15 also show additional electrical contact configurations which can be used as alternatives to, or together with, other contact configurations. Each electrical contact as shown in FIG. 10 includes a conductive roller 120, which is preferably spherical in geometry. Rollers having other suitable geometrical shapes, such as cylindrical rollers, may be used. The rollers are preferably coated with a corrosion resistant material such as gold, platinum, palladium, their alloys, or some other appropriate contact alloy material.

The roller 120 may be housed in an arrangement that may include, but is not limited to, a contact spring 122 to supply electrical power from the cathode plate (not shown) to the roller 120. The end of the spring 122 also acts as a bearing surface. The spring 122 allows for a gentle but dynamic loading of the roller 120 on the surface of the workpiece. Each spring 122 biases its respective roller toward the wafer surface. In the configuration shown in FIG. 10, the electrical contact per se is formed by the roller 120 and the spring 122 which supports the roller. Each spring 122 extends between the cathode plate (not shown in FIG. 10), on which the spring is supported in any appropriate fashion, and the roller 120 supported by the spring. Both the spring 122 and the roller 120 are surrounded by an insulator 124 of a ceramic or other appropriate dielectric material that isolates the spring 122 and the roller 120 from an electric field during the process of plating Cu out of the electrolyte. The insulator 124 may be configured similarly to the insulator 26, represented in FIG. 4, but can include a shaped tip 128. The shaped tip 128 and a seal 126 are disposed around the roller 120. The seal 126 may be adhesively or otherwise secured to the inner surface of the shaped tip.

Figure 14:
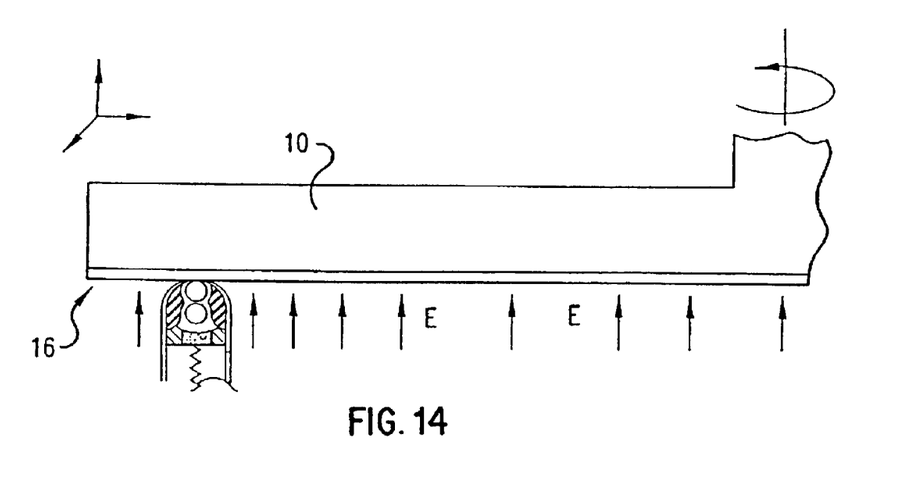
FIG. 14 is a schematic illustration of a single electrical contact such as that shown in FIG. 13 while in contact with a wafer surface during application of an electric field.

The seal arrangement is such that the roller 120 rotates freely with respect to the seal 126. The electrolyte fluid boundary layer, and, if the electrolyte forming the subject matter of copending application Ser. No. 09/544,558 mentioned above is used, especially the additive in the electrolyte, helps lubricate the roller surface. In addition to housing the roller 120 and the seal 126, the tip 128 also prevents the roller 120 from exposure to the electric field. FIG. 14, which shows one electrical contact with a different configuration in use, indicates an applied electric field by reference characters E. The tip and seal configuration helps prevent or minimize material deposition on the roller 120.

Figure 11:
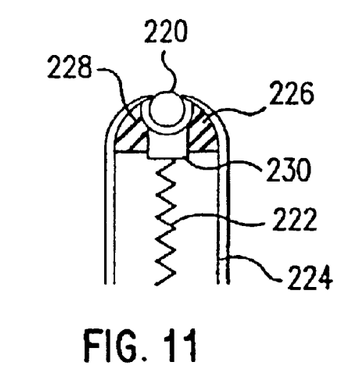
FIG. 11 shows a further electrical contact.

FIG. 11 shows another configuration in which a rolling pad 230 of conducting material (e.g. metal), preferably with a partially spherical shaped surface, is disposed between the contact spring 222 and a spherical roller 220. The roller 220 rests on the shaped rolling pad 230. The shaped tip 228 and the seal 226 cooperate with the spring biased rolling pad 230 to confine the roller 220 while allowing it to rotate freely along any direction. In a manner similar to the roller 120 of FIG. 10, the roller 220 protrudes partly through but is restrained by the perimeter of an end opening in the insulator 224 which surrounds the seal 226, the spring 222, and the rolling pad 230. In the configuration shown in FIG. 11, therefore, the electrical contact per se is formed by the roller 220, the spring 222, and the spring biased rolling pad 230 disposed between the roller and the spring.

Figure 12:
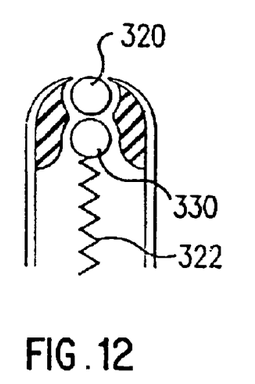
FIG. 12 shows still another electrical contact.

FIG. 12 shows that a conductive roller 320 may rest on a support member 330 having, for example, a spherical supporting surface rather than on a rolling pad. Multiple support members could be used beneath the roller 320. Such an arrangement is ideal for self-aligned roller contact. In the configuration shown in FIG. 12, the electrical contact per se is formed by the roller 320, the spring 322, and the support member 330.

Besides the advantage of self alignment, the rolling friction between the roller 320 and the substrate or workpiece is greatly reduced, especially when the workpiece rotates or translates during the process of plating Cu out of the electrolyte. The reduced friction minimizes undesirable workpiece scratching and damage as well as particulate generation.

Figure 13:
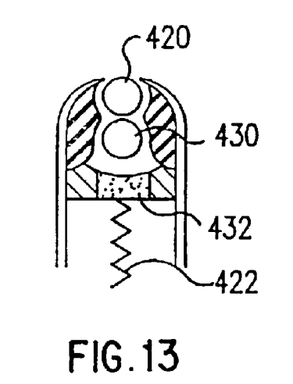
FIG. 13 shows one more electrical contact.
Figure 15:
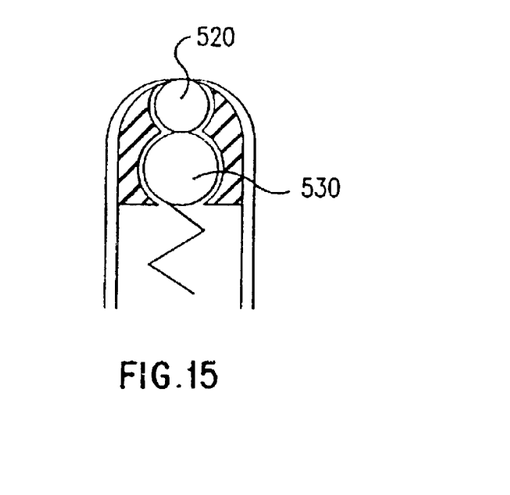
FIG. 15 shows part of another electrical contact which is similar to those of FIGS. 12 and 13 but in which a roller and a roller support member have different sizes.

Other suitable support member geometries could also be used. For instance the cross section of the support member may be triangular, or the roller support may rest on the knife edge of a support member. In another configuration, shown in FIG. 13, a spherical support 430 is disposed between a conductive roller pad 432 and the roller 420. In FIG. 13, the electrical contact per se is formed by the roller 420, the conductive spring 422, the conductive spherical support 430, and the spring biased and conductive rolling pad 432. FIG. 14 shows the configuration of FIG. 13 in use during conductive material deposition. Also, as shown in FIG. 15, the size of the roller 520 may be different from that of the roller support member 530.

The roller material, the contact spring material, and the like must be such that they do not degrade or dissolve in the electrolyte of interest. It is also desirable that these materials do not degrade the quality of the material deposited. The roller, for example, can not excessively scratch the deposited film or generate very undesirable particulates. Numerous face contacts may be made around the periphery of the wafer. The individual contacts may be discrete and range from 4 to about 2000 in number, depending on size of the substrate. As the size of the wafer or substrate increases, the number of electrical contacts used should also increase. The roller contacts could also be a continuous race track or a track which is split into several elements. For example, the periphery may be divided into quadrants or octets. Each quadrant, etc., may contain many more or less uniformly dispersed roller contacts or contact tips.

Although the foregoing and following description refers to electroplating, the techniques and apparatuses described are directly applicable to an electro-etching or electropolishing technique or apparatus. In these cases, the polarity of the voltage applied between the anode and cathode plates is reversed, making the substrate surface more positive. A special electroetching electrolyte also could be used.

Figure 16:
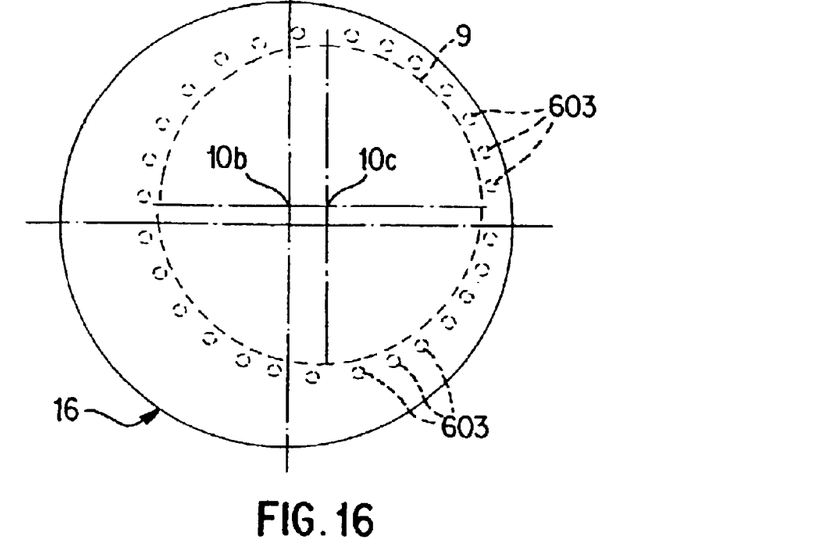
FIG. 16 is a view, from above a wafer or substrate which is to be plated, schematically showing electrical contacts surrounding a circular anode area which can be used according to the present invention.
Figure 17:
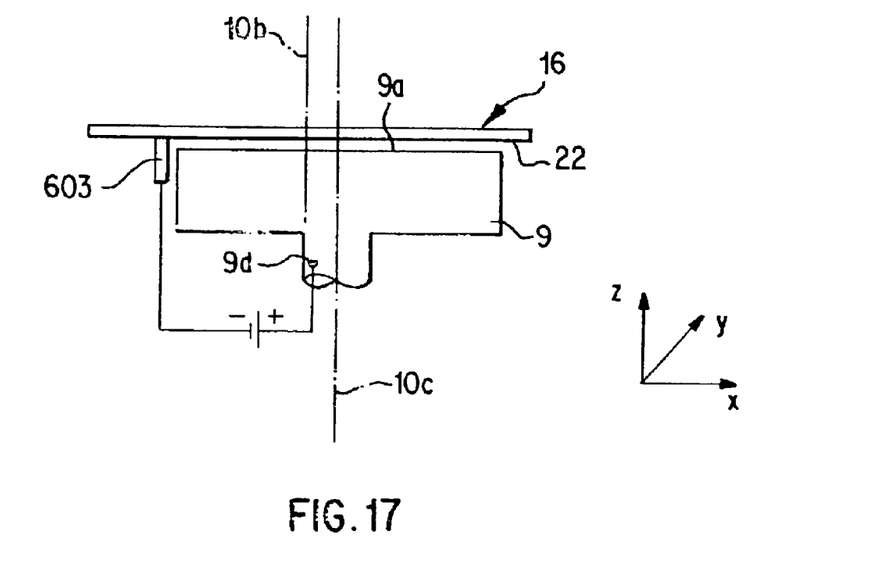
FIG. 17 is a side view of the schematically illustrated assembly of FIG. 16 but in which only one of the electrical contacts is shown for reasons of clarity.

One preferred apparatus which can be used to make electrical contact according to this invention is shown in FIGS. 16 and 17. Electrical contact to the electrolyte 9a is made via an electrode (or anode) in the form of a round anode plate 9 which, as illustrated, has a diameter smaller than the diameter of the wafer or substrate 16. The anode plate 9 of FIGS. 16 and 17 can have essentially the same construction as that of the anode plate 9 of FIG. 3. Holes in the anode plate 9 of FIGS. 16 and 17 for electrical contact pin accommodation, however, are not needed for reasons which will be come clear. As in the plating apparatus shown in FIG. 3, a work piece carrier head (not shown in FIGS. 16 and 17), which holds the wafer 16, can be rotated around a first axis 10b, while the anode plate 9 can turn around a second axis 10c. The carrier head, the anode plate 9, or both, can also be translated in the x, y, and/or z directions. An electrical contact 9d is provided to the anode plate.

Electrical contact to the wafer frontal side 22, rendering the wafer barrier layer and/or the wafer seed layer cathodic, is made outside the anode area via a set of electrical contacts 603. The anode area is shown in phantom in FIG. 16 and, as illustrated, is circular. The electrical contacts surround and are preferably situated concentric with the anode plate 9 as shown in FIG. 16. The wafer 16 is allowed to rotate and move with respect to the anode plate 9 and the wafer contacts 603. In this way, there is no restriction on electrochemical plating all the way to the edge of the wafer 16 or, more particularly, the edge of the seed layer on the wafer. The anode plate 9 may also be allowed to rotate with respect to the contacts 603, but this is not a necessary condition. The electrical wafer contacts 603 could be conductive wires or pins pushed against the wafer, but could also be spherical balls pushed or spring-loaded against the wafer. The electrical wafer contacts 603 per se of FIGS. 16–18 can have the same structure as any of the electrical contacts previously described in connection with FIGS. 4, 10–13, and 15, and can be constructed of the same materials. Combinations of various previously described electrical contact surfaces are also contemplated. The contacts 603 are mounted on or interconnected with a cathodic element such as a contact ring, similar to that which will be described in connection with FIGS. 20 and 21, rather than with a cathode plate as described in connection with FIG. 4.

The wafer 16, in each embodiment of FIGS. 16–22, can be vacuum mounted, without clamping, to the workpiece carrier head (not shown). One way by which vacuum mounting can be achieved is described in application Ser. No. 09/472,523 mentioned earlier. Other ways of vacuum mounting the wafer to a workpiece carrier head could readily be made and used by those of ordinary skill in the art.

Figure 18:
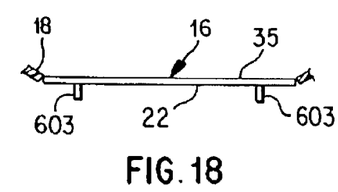
FIG. 18 shows an electrolyte seal location, right at a perimeter edge of a wafer, which permits full wafer face plating with zero edge exclusion.
Figure 19:
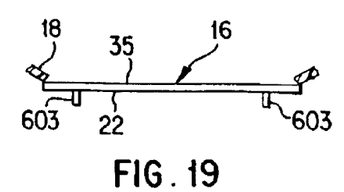
FIG. 19 shows another electrolyte seal location, on a surface of a wafer facing away from an electrolyte, which permits full wafer face plating with zero edge exclusion.

FIGS. 18 and 19 show how the present invention permits full-face plating with zero edge exclusion. A seal 18 can be located right at the perimeter edge of the wafer 16 (FIG. 8) or may even be disposed on the surface 35 of the wafer 16 facing away from the electrolyte (FIG. 19) in a manner similar to that previously described in connection with FIG. 6. The contacts 603, therefore, can sweep the whole wafer frontal side surface 22, and can also slide off of this surface, so as to allow conductive material plating over the whole surface 22.

Figure 20:
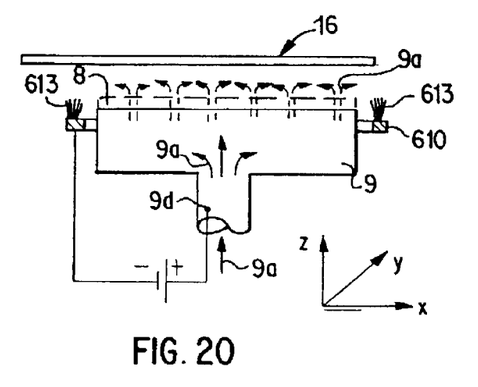
FIG. 20 is a view similar to FIG. 16 but in which electrical contacts with alternative configurations are provided.
Figure 21:
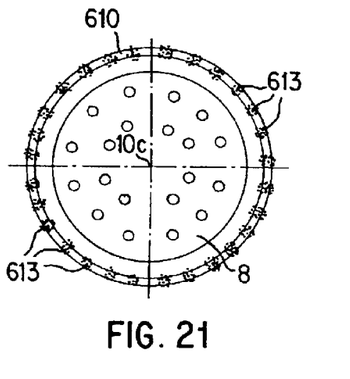
FIG. 21 is a top view of the porous pad overlying the anode plate, and of the electrical contacts, of FIG. 20.

FIGS. 20 and 21 show a preferred electrical wafer contact structure which differs from that of FIGS. 16 and 17. The anode plate 9 illustrated in FIG. 20 is constructed the same as the anode plate 9 of FIGS. 16 and 17. Again, a workpiece carrier head (not shown), which holds the wafer 16, can be rotated around a first axis, while the anode plate 9 can turn around a second axis. The carrier head, the anode plate 9, or both can also be translated in the x, y, and/or z directions. An electrical contact 9d is provided to the anode plate. FIG. 20 also schematically illustrates the flow of the electrolyte 9a through both the anode plate 9 and a porous pad 8, which is also shown in FIGS. 20 and 21. The pad 8 can have an appropriately adapted design similar to any of those disclosed by either U.S. patent application Ser. No. 09/511,278 or U.S. patent application Ser. No. 09/621,969 mentioned previously, and permits through-flow of the electrolyte 9a. The pad 8 is shown in phantom in FIG. 20, since the pad may or may not be provided, depending on the particular operation which is to be performed. No pad is necessary for plating or etching. For plating and polishing, however, a pad 8 is necessary.

A contact ring 610, formed of a conductive metal, a conductive metal alloy, or some other appropriately conductive material, surrounds but is spaced from the perimeter of the anode plate 9. The contact ring 610 could, for example, be connected with a housing within which the anode plate 9 is movable back and forth in the z direction. Electrical contacts, in the form of conductive brushes or any of the previously mentioned conductive pins, wires, balls, rollers, etc., or combinations thereof (conductive brushes 613 are shown in FIGS. 20 and 21), are disposed on or mounted to the contact ring 610 and can be pushed or spring loaded against the wafer frontal side.

As the contact pins, brushes, etc., on the cathode contact ring 610 touch or otherwise electrically interconnect with the wafer surface 22, the wafer 16 is moved with respect to the anode plate 9. The contacts, such as brushes 613, may make physical contact to the surface of the wafer and may be partially or fully displaced off, or outside, of the wafer surface for certain periods of time during plating. This permits control of the conductive material deposit uniformity.

Figure 22:
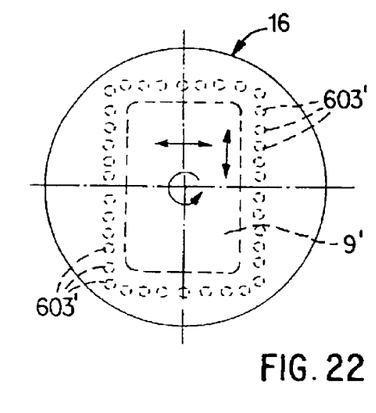
FIG. 22 is a view similar to FIG. 16 but showing one example of a non-circular anode area.

FIG. 22, which is a view similar to FIG. 16, shows that it is possible to have other, differently shaped contact rings and/or anode plate assemblies with non-circular anode areas. FIG. 22 illustrates, by way of example only, a rectangular anode plate 9', a set of electrical contacts 603' arranged in a rectangular configuration around the anode plate 9', and a wafer 16. The anode plate 9', the wafer 16, or both are movable with respect to one another in the directions indicated by arrows to effect proper plating, etching, or plating and polishing operations. Again, the contacts can be, for example, pins with rounded tips, rollers, in the form of brushes, or various combinations of these configurations.

The foregoing disclosure has been set forth to illustrate the invention and the best mode, and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of modifying a workpiece having a frontal surface wetted by a process solution using an electrode touching the process solution and a plurality of electrical contacts comprising the steps of:

making electrical contact to the workpiece frontal surface by pressing the electrical contacts against the frontal surface of the workpiece;

applying an electrical potential between the electrode and the electrical contacts; and moving the workpiece and the electrical contacts relative to one another.

2. The method of claim 1, further comprising the step of reversing the electrical potential between the electrode and the electrical contacts.

3. The method of claim 1, further comprising the step of sliding at least some of the electrical contacts laterally off of the workpiece frontal surface while performing the moving step.

4. The method of claim 1, wherein the moving step includes the step of displacing a carrier head holding the workpiece.

5. The method of claim 1, wherein the moving step includes the step of displacing the electrode and the electrical contacts.

6. The method of claim 1, wherein the moving step includes the step of displacing a carrier head holding the workpiece and displacing the electrode and the electrical contacts.

7. The method of claim 1, wherein the electrical contacts include any of pins, rollers, wires, and brushes.

8. An apparatus for modifying a workpiece having a workpiece frontal side comprising:

an electrode having an electrode area configured to face the workpiece frontal side;

electrical contacts located outside of the electrode area and configured to electrically connect to the workpiece frontal side by pushing the electrical contacts against the workpiece frontal side; and a mechanism configured to move the workpiece and the electrical contacts relative to one another while maintaining electrical contact to the workpiece;

wherein the apparatus is configured to apply an electrical potential between the electrode and the electrical contacts to modify the workpiece.

9. The apparatus defined in claim 8, wherein at least some of the electrical contacts can slide laterally off of the workpiece frontal side while moving the workpiece frontal side with respect to the electrode and the electrical contacts.

10. The apparatus of claim 8, wherein the electrical contacts include pins surrounding the electrode area.

11. The apparatus of claim 8, wherein the electrical contacts include wires surrounding the electrode area.

12. The apparatus of claim 8, wherein the electrical contacts include conductive brushes surrounding the electrode area.

13. The apparatus of claim 12, further comprising a contact ring by which the conductive brushes are supported so as to surround the electrode area.

14. The apparatus of claim 8, and further comprising a porous pad overlying the electrode to polish the frontal side.

15. The apparatus of claim 8, wherein the workpiece is displaced so as to move the workpiece frontal side with respect to the electrode and the electrical contacts.

16. The apparatus of claim 8, wherein the electrode and the electrical contacts are displaced so as to move the workpiece frontal side with respect to the electrode and the electrical contacts.

* * * * *